(12) United States Patent
Ko et al.

(10) Patent No.: US 11,649,402 B2
(45) Date of Patent: May 16, 2023

(54) METHOD OF PREPARING QUANTUM DOT, OPTICAL MEMBER COMPRISING QUANTUM DOT, AND APPARATUS COMPRISING QUANTUM DOT

(71) Applicants: Samsung Display Co., Ltd., Yongin-si (KR); Hannam University Institute for Industry-Academia Cooperation, Daejeon (KR)

(72) Inventors: Yunhyuk Ko, Yongin-si (KR); Kwangsup Lee, Daejeon (KR); Prabhakaran Prem, Daejeon (KR); Changhee Lee, Yongin-si (KR); Gyeongju Kim, Daejeon (KR); Sinil Choi, Daejeon (KR)

(73) Assignee: Samsung Display Co., Ltd., Yongin-si (KR)

( * ) Notice: Subject to any disclaimer, the term of this patent is extended or adjusted under 35 U.S.C. 154(b) by 303 days.

(21) Appl. No.: 17/034,861

(22) Filed: Sep. 28, 2020

(65) Prior Publication Data
US 2021/0214610 A1    Jul. 15, 2021

(30) Foreign Application Priority Data
Jan. 10, 2020    (KR) .................. 10-2020-0003801

(51) Int. Cl.
*C09K 11/88*    (2006.01)
*C09K 11/54*    (2006.01)
(Continued)

(52) U.S. Cl.
CPC .............. *C09K 11/88* (2013.01); *C09K 11/54* (2013.01); *H01L 33/502* (2013.01);
(Continued)

(58) Field of Classification Search
CPC ......... C09K 11/88; C09K 11/54; C09K 11/02; C09K 11/70; C09K 11/883; C09K 11/565;
(Continued)

(56) References Cited

U.S. PATENT DOCUMENTS 10,209,560 B2    2/2019  Lee et al.
10,550,325 B2    2/2020  Kan
(Continued)

FOREIGN PATENT DOCUMENTS

KR    10-2019-0009025 A    1/2019
KR    10-2019-0015516 A    2/2019

OTHER PUBLICATIONS

Huang et al., "Color Converting Film With Quantum-Dots for the Liquid Crystal Displays Based on Inkjet Printing", IEEE Photonics Journal, Jun. 2019, pp. 1-9, vol. 11, No. 3, IEEE Photonics Society.
(Continued)

*Primary Examiner* — Jonathan Han
(74) *Attorney, Agent, or Firm* — Lewis Roca Rothgerber Christie LLP

(57) ABSTRACT

A method of preparing a quantum dot, a quantum dot prepared by the method, an optical member including the quantum dot, and an apparatus including the quantum dot. The quantum dot may include: a core including a III-V compound; a first shell surrounding the core and including ZnSe; a second shell surrounding the first shell and including $ZnSe_{1-x}S_x$, wherein x may be a real number greater than 0 and smaller than 1; and a third shell surrounding the second shell and including ZnS. The method may include: forming the first shell from a first material including zinc and a second material including selenium in a solution; forming the second shell by adding to the solution a third material including zinc and a fourth material including selenium and
(Continued)

sulfur; and forming the third shell by adding to the solution a fifth material including zinc.

20 Claims, 8 Drawing Sheets

(51) Int. Cl.
*H01L 51/50* (2006.01)
*H01L 33/50* (2010.01)
*B82Y 40/00* (2011.01)
*B82Y 20/00* (2011.01)

(52) U.S. Cl.
CPC .......... *H01L 51/5036* (2013.01); *B82Y 20/00* (2013.01); *B82Y 40/00* (2013.01)

(58) Field of Classification Search
CPC . C09K 11/025; H01L 33/502; H01L 51/5036; H01L 27/322; H01L 33/505; H01L 33/06; H01L 33/28; H01L 33/30; H01L 33/58; B82Y 20/00; B82Y 40/00; B82Y 30/00; G02F 1/1336
See application file for complete search history.

(56) References Cited

U.S. PATENT DOCUMENTS

| | | | |
|---|---|---|---|
| 2014/0117292 A1* | 5/2014 | Jun | H01L 31/0304 252/519.14 |
| 2015/0083969 A1* | 3/2015 | Kim | C09K 11/705 977/774 |
| 2017/0352779 A1* | 12/2017 | Kuzumoto | C08K 9/08 |
| 2018/0094190 A1* | 4/2018 | Kim | C09K 11/61 |
| 2018/0163129 A1* | 6/2018 | Won | H01L 31/0384 |

OTHER PUBLICATIONS

Altintas et al., "Highly Efficient Cd-Free Alloyed Core/shell Quantum Dots with Optimized Precursor Concentrations", The Journal of Physical Chemistry C, Mar. 17, 2016, pp. 1-23, 120(14), American Chemical Society, Washington, DC.

Ippen et al., "InP/ZnSe/ZnS: A Novel Multishell System for InP Quantum Dots for Improved Luminescence Efficiency and Its application in a Light-Emitting Device", Journal of Information Display, Jun. 22, 2012, pp. 91-95, vol. 13, No. 2, Taylor & Francis.

Lim et al., "InP@ZnSeS, Core@Composition Gradient Shell Quantum Dots with Enhanced Stability", Chemistry of Materials, Sep. 30, 2011, pp. 4459-4463, 23 (20), American Chemical Society.

* cited by examiner

METHOD OF PREPARING QUANTUM DOT, OPTICAL MEMBER COMPRISING QUANTUM DOT, AND APPARATUS COMPRISING QUANTUM DOT

CROSS-REFERENCE TO RELATED APPLICATION

This application claims priority to and the benefit of Korean Patent Application No. 10-2020-0003801, filed on Jan. 10, 2020, in the Korean Intellectual Property Office, the disclosure of which is incorporated herein in its entirety by reference.

BACKGROUND

1. Field

One or more embodiments relate to a method of preparing a quantum dot, an optical member including the quantum dot, and an apparatus including the quantum dot.

2. Description of Related Art

A quantum dot is a nanocrystal of a semiconductor material and may exhibit a quantum confinement effect. The quantum dot receives light from an excitation source, and when an energy excitation state is reached, the quantum dot emits energy (e.g., light) according to the corresponding energy band gap. Here, even for quantum dots formed of the same material, the wavelength (of the emitted light) varies depending on the particle size. Thus, by adjusting the size of the quantum dot, light (emitted) in a desired wavelength range may be obtained, and characteristics such as suitable (e.g., excellent) colorimetric purity and/or high luminescence efficiency may be achieved. Therefore, the quantum dot may be applied to various suitable devices or apparatuses.

A lighting apparatus system may be applicable to various suitable usages. For example, a lighting apparatus may be utilized in indoor or outdoor lighting, stage lighting, decorative lighting, and/or a backlight unit (BLU) in a liquid crystal display (LCD) utilized in portable electronic products (mobile phones, camcorders, digital cameras, personal digital assistants (PDAs), and/or the like).

A typical usage of the lighting apparatus is, for example, as a BLU in LCDs. LCDs are one kind (e.g., type) of flat panel display devices which are currently being widely utilized. LCDs include two panels having formed thereon field-generating electrodes such as pixel electrodes, common electrodes, and/or the like, and a liquid crystal layer between the two panels. LCDs display images by applying a voltage to the field-generating electrodes to generate an electric field on the liquid crystal layer, changing an orientation in which the liquid crystal molecules of the liquid crystal layer are aligned by utilizing the electric field, and controlling polarization of incident light.

For color formation, LCDs utilize color-conversion members. When light emitted from the backlight light source passes through the red, green, and/or blue color-conversion members, the amount of light is reduced by each color-conversion member to about ⅓, leading to a poor light efficiency.

In order to complement (compensate) for such decrease in light efficiency and to achieve suitable (e.g., excellent) color reproducibility, blue light-emitting device (LED) is recently utilized as a light source, and research and development on applying a quantum dot-containing quantum dot enhancement film (QDEF) to the LCD backlight for improving color purity and display efficiency are being conducted.

A QDEF is in a form in which green and red quantum dots are dispersed in resin and sheeted, and then wrapped with two barrier films. The barrier films serve to protect the quantum dots from external moisture and oxygen. In general, a polyethylene terephthalate (PET) material is utilized as a barrier film, and cadmium-based quantum dots having suitable (e.g., excellent) performance and high color reproducibility are mainly utilized as the quantum dots. However, a QDEF has a problem in that quantum dot aggregation may occur in the resin, the emission wavelength of light may be widened, and the emission intensity may be deteriorated. In addition, cadmium-based quantum dots contain cadmium, a toxic element, and are restricted in usage according to the Restriction of Hazardous Substances Directive (RoHS).

SUMMARY

Aspects according to one or more embodiments are directed toward a method of preparing an eco-friendly quantum dot having suitable (e.g., excellent) color reproducibility, an optical member including the quantum dot, and an apparatus including the quantum dot.

Additional aspects will be set forth in part in the description which follows and, in part, will be apparent from the description, or may be learned by practice of the presented embodiments of the disclosure.

According to one or more embodiments, a quantum dot may include:
a core including a III-V compound;
a first shell surrounding the core and including ZnSe;
a second shell surrounding the first shell and including $ZnSe_{1-x}S_x$, wherein x may be a real number greater than 0 and smaller than 1; and
a third shell surrounding the second shell and including ZnS. A method of preparing the quantum dot may include:
forming the first shell from a first solution including a first material including zinc and a second material including selenium;
forming the second shell by adding to the first solution a third material including zinc and a fourth material including selenium and sulfur to form a second solution; and
forming the third shell, by adding to the second solution, a fifth material including zinc, wherein
the forming of the first shell may include act (a) of adding the first material and act (b) of adding the second material, and
the forming of the second shell may include act (c) of adding the third material and act (d) of adding the fourth material.

According to one or more embodiments, a quantum dot prepared according to the method may be provided.

According to one or more embodiments, an optical member including the quantum dot may be provided.

According to one or more embodiments, an apparatus including the quantum dot may be provided.

BRIEF DESCRIPTION OF THE DRAWINGS

The above and other aspects, features, and enhancements of certain embodiments of the disclosure will be more apparent from the following description taken in conjunction with the accompanying drawings, in which.

DETAILED DESCRIPTION

Figure 1:
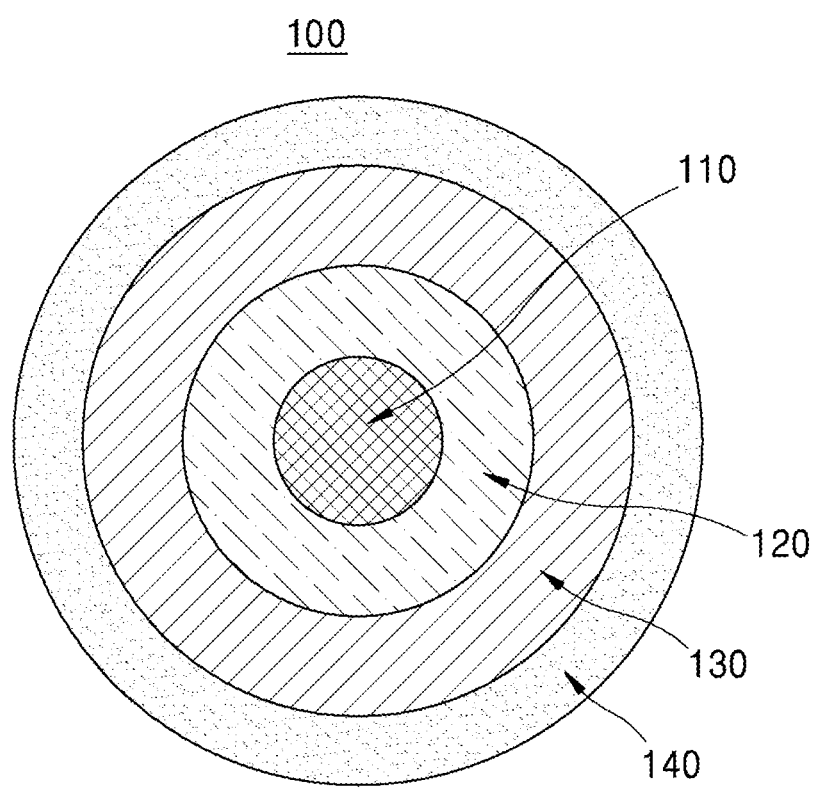
FIG. 1 is a schematic view of a quantum dot according to an embodiment.

Reference will now be made in more detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

It will be understood that, although the terms "first," "second," etc. may be used herein to describe various elements, these elements should not be limited by these terms. These terms are only used to distinguish one element from another.

In the embodiments described in the present specification, an expression used in the singular encompasses the expression of the plural, unless it has a clearly different meaning in the context.

In the present specification, it is to be understood that the terms such as "including," "having," and "comprising" are intended to indicate the existence of the features or components disclosed in the specification, and are not intended to preclude the possibility that one or more other features or components may exist or may be added. For example, unless otherwise limited, terms such as "including" or "having" may refer to either consisting of features or components described in the specification only, or further including other components.

In this specification, "Group III" may include a Group IIIA element and a Group IIIB element of the IUPAC Periodic Table of Elements. Non-limiting examples of a Group III metal include, aluminum (Al), indium (In), gallium (Ga), and titanium (Ti).

In this specification, the term "quantum yield" and the term "luminescence efficiency" may be used in substantially the same sense (e.g., interchangeably).

In this specification, the term "color gamut" has the same meaning as "color reproducibility" and is a numerical representation of how much the original color may be expressed on a screen. The term "color gamut" refers to a range of color that may be expressed in a display.

Hereinafter, a quantum dot 100 according to an embodiment and a method of preparing the quantum dot 100 will be described with reference to FIG. 1.

In some embodiments, the quantum dot 100 may include: a core 110 including a III-V compound; a first shell 120 surrounding the core 110 and including ZnSe; a second shell 130 surrounding the first shell 120 and including $ZnSe_{1-x}S_x$, wherein x may be a real number greater than 0 and smaller than 1; and a third shell 140 surrounding the second shell 130 and including ZnS.

A method of preparing the quantum dot may include: forming the first shell 120 from a first material including zinc and a second material including selenium in a solution (that is, forming the first shell 120 from a first solution including the first material and the second material);

forming the second shell 130 by adding to the (first) solution a third material including zinc and a fourth material including selenium and sulfur (that is, adding the third material including zinc and the fourth material including selenium and sulfur to the first solution to form a second solution); and forming the third shell 140 by adding to the (second) solution a fifth material including zinc, wherein the forming of the first shell 120 may include process (e.g., act) (a) of adding the first material and process (e.g., act) (b) of adding the second material, and the forming of the second shell 130 may include process (e.g., act) (c) of adding the third material and process (e.g., act) (d) of adding the fourth material.

In some embodiments, the forming of the first shell 120 may include performing each of process (e.g., act) (a) and process (e.g., act) (b) (e.g., alternatively) at least two times.

In some embodiments, the forming of the first shell 120 may include sequentially conducting: process (e.g., act) (a1) of adding the first material; process (e.g., act) (b1) of adding the second material; process (e.g., act) (a2) of adding the first material; and process (e.g., act) (b2) of adding the second material.

In some embodiments, in the method of preparing the quantum dot, as process (e.g., act) (a1), process (e.g., act) (b1), process (e.g., act) (a2), and process (e.g., act) (b2) are sequentially performed, a reaction temperature may gradually increase. In some embodiments, a temperature at which process (e.g., act) (b1) is performed may be higher than a temperature at which process (e.g., act) (a1) is performed. In some embodiments, a temperature at which process (e.g., act) (a2) is performed may be higher than a temperature at which process (e.g., act) (b1) is performed. In some embodiments, a temperature at which process (e.g., act) (b2) is performed may be higher than a temperature at which process (e.g., act) (a2) is performed.

In some embodiments, the forming of the first shell 120 may further include, sequentially conducting: process (e.g., act) (a3) of adding the first material; process (e.g., act) (b3) of adding the second material; and/or the like.

In some embodiments, the forming of the first shell 120 may be performed at a temperature range from about 180° C. to about 320° C., for example, about 200° C. to about 300° C.

In some embodiments, the forming of the second shell 130 may include repeatedly performing each of process (c) and process (d) (e.g., alternatively) at least two times.

In some embodiments, the forming of the second shell 130 may include, sequentially conducting: process (e.g., act) (c1) of adding the third material; process (e.g., act) (d1) of adding the fourth material; process (e.g., act) (c2) of adding the third material; and process (e.g., act) (d2) of adding the fourth material.

In some embodiments, in the method of preparing the quantum dot, as process (e.g., act) (c1), process (e.g., act) (d1), process (e.g., act) (c2), and process (e.g., act) (c2) are sequentially performed, a reaction temperature may gradually increase. In some embodiments, a temperature at which process (e.g., act) (d1) is performed may be higher than a temperature at which process (e.g., act) (c1) is performed. In some embodiments, a temperature at which process (e.g., act) (c2) is performed may be higher than a temperature at which process (e.g., act) (d1) is performed. In some embodiments, a temperature at which process (e.g., act) (d2) is performed may be higher than a temperature at which process (e.g., act) (c2) is performed.

In some embodiments, the forming of the second shell 130 may further include, sequentially conducting: process (e.g., act) (c3) of adding the third material; process (e.g., act) (d3) of adding the fourth material; and/or the like.

In some embodiments, the forming of the second shell 130 may be performed at a temperature range from about 240° C. to about 340° C., for example, about 260° C. to about 320° C.

In some embodiments, the first material and the third material may each include a zinc precursor, and the zinc precursor may be at least one selected from dimethyl zinc, diethyl zinc, zinc acetate, zinc acetylacetonate, zinc iodide, zinc bromide, zinc chloride, zinc fluoride, zinc carbonate, zinc cyanide, zinc nitrate, zinc oxide, zinc peroxide, zinc perchlorate, and zinc sulfate.

In some embodiments, the first material may include zinc stearate.

In some embodiments, the third material may include zinc stearate.

In some embodiments, the first material and the third material may be identical to each other. In some embodiments, the first material and the third material may be different from each other.

In some embodiments, the second material may include selenium powder.

In some embodiments, the second material may include selenium powder and an organic ligand. In some embodiments, the second material may include selenium powder and trioctylphosphine.

In some embodiments, the fourth material may include selenium powder and sulfur powder.

In some embodiments, a molar ratio between selenium powder and sulfur powder may be in a range of about 0.1:1 to about 0.0005:1 in the fourth material. In some embodiments, when the forming of the second shell 130 includes process (e.g., act) (c1), process (e.g., act) (d1), process (e.g., act) (c2), and process (e.g., act) (d2), the fourth material utilized in process (e.g., act) (d1) and the fourth material utilized in process (e.g., act) (d2) may have different molar ratios between selenium powder and sulfur powder.

In some embodiments, the fourth material utilized in process (e.g., act) (d1) may have a molar ratio between selenium powder and sulfur powder in a range of about 0.02:1 to about 0.04:1, for example, about 0.025:1 to about 0.035:1, or for example, of about 0.03:1.

In some embodiments, the fourth material utilized in process (e.g., act) (d2) may have a molar ratio between selenium powder and sulfur powder in a range of about 0.01:1 to about 0.001:1, for example, about 0.02:1 to about 0.002:1, or for example, of about 0.005:1.

In compositions of the first shell, the second shell, and the third shell, the first shell close to the core may include Se (e.g., no S), and the second shell may include Se and S, and the third shell may include S (e.g., no Se). Overall, as the distance is farther away from the core, the proportion of S to Se may be higher. Thus, the quantum dot may have a structure in which lattice mismatch decreases at an interface between the core and the first shell, and between the shells. Accordingly, the quantum dot may have a reduced full width of half maximum (FWHM) and improved luminescence efficiency and structural stability.

In some embodiments, a content of selenium in $ZnSe_{1-x}S_x$ included in the second shell may be greater toward the first shell and lower toward the third shell, thus forming a concentration gradient. In some embodiments, an x value at an interface between the second shell and the first shell may be smaller, and an x value at an interface between the second shell and the third shell may be greater. In addition, for example, the x value may increase from the interface between the second shell and the first shell to the interface between the second shell and the third shell.

In some embodiments, the III-V compound included in the core may be GaN, GaP, GaAs, GaSb, AlN, AlP, AlAs, AlSb, InN, InP, InAs, InSb, GaNP, GaNAs, GaNSb, GaPAs, GaPSb, AlNP, AlNAs, AlNSb, AlPAs, AlPSb, InGaP, InNP, InNAs, InNSb, InPAs, InPSb, GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a combination thereof.

In some embodiments, a radius of the core may be in a range of about 0.5 nanometers (nm) to about 2.5 nm, for example, about 0.6 nm to about 2.4 nm, for example, about 0.75 nm to about 2.25 nm, or for example, about 1 nm to about 2 nm.

In some embodiments, the method of preparing the quantum dot may further include forming the core 110. The method of forming the core 110 may include forming a III-V compound from a Group III precursor and a Group V precursor.

In some embodiments, the forming of the core 110 may be performed at a temperature range from about 240° C. to about 340° C., for example, about 260° C. to about 320° C.

In some embodiments, the forming of the third shell 140 may be performed at a temperature lower than a temperature in the forming of the second shell. In some embodiments, the fifth material may include at least one selected from the zinc precursors. In some embodiments, the fifth material may include zinc acetate.

In addition, in some embodiments, the fifth material may include a zinc precursor and an organic ligand. In some embodiments, the organic ligand may be trioctylphosphine, trioctylphosphine oxide, oleic acid, oleylamine, octylamine, trioctylamine, hexadecylamine, octanethiol, dodecanethiol, hexylphosphonic acid, tetradecylphosphonic acid, octylphosphonic acid, or a combination thereof.

In some embodiments, a molar ratio between the zinc precursor and the organic ligand in the fifth material may be in a range of about 0.5:1 to about 0.7:1, for example, about 0.55:1 to about 0.65:1, or for example, about 0.6:1.

In some embodiments, the solution utilized in the method of preparing the quantum dot may further include the zinc precursor and the organic ligand, in addition to the materials described above.

In some embodiments, a solvent included in the solution may be an organic solvent. For example, the solvent may be oleylamine, 1-octadecene, and/or the like.

The method of preparing the quantum dot may be understood to one of ordinary skill in the art by referring to the Examples provided herein.

The first shell, the second shell, and the third shell of the quantum dot may each serve as a protective layer for reducing or preventing chemical denaturation of the core to maintain semiconductor characteristics and/or as a charging layer for imparting electrophoretic characteristics to the quantum dot.

In some embodiments, a thickness of each of the first shell, the second shell, and the third shell may be in a range of about 0.5 nm to about 2 nm, for example, about 0.6 nm to about 1.9 nm, for example, about 0.7 nm to about 1.8 nm, for example, about 1.0 nm to about 1.7 nm, or for example, about 1.2 nm to about 1.5 nm.

The quantum dot may emit visible light other than blue light. For example, the quantum dot may emit light having a maximum emission wavelength in a range of about 500 nm to about 650 nm. Accordingly, when the quantum dot is applied to a color-conversion member, blue light may be absorbed to emit wavelengths in various suitable color ranges.

In some embodiments, the quantum dot may emit green light having a maximum emission wavelength in a range of about 500 nm to about 750 nm. In some embodiments, the quantum dot may emit red light having a maximum emission wavelength in a range of about 600 nm to about 750 nm. Accordingly, when the quantum dot is applied to a color-conversion member, green or red light with high luminance and suitable (e.g., excellent) colorimetric purity may be obtained.

In some embodiments, a diameter of the quantum dot may be in a range of about 3 nm to about 13 nm. For example, a diameter of the quantum dot may be in a range of about 4 nm to about 12 nm, for example, about 4 nm to about 8 nm, for example, about 5 nm to about 11 nm, for example, about 6 nm to about 10 nm, or for example, about 7 nm to about 9 nm. In some embodiments, a diameter of the quantum dot may be in a range of about 4 nm to about 6 nm, and the quantum dot may emit green light.

In some embodiments, a diameter of the quantum dot may be in a range of about 7 nm to about 9 nm and the quantum dot may emit red light.

In some embodiments, the quantum dot may have an optical absorption rate for blue light (for example, blue light having a wavelength of 461 nm) of 80 percent (%) or higher. Accordingly, when the quantum dot is applied to a color-conversion member, absorption of blue light from a light source may be suitable (e.g., excellent) to thereby enable highly efficient optical conversion and emit green light having a high colorimetric purity.

In some embodiments, a FWHM of an emission wavelength spectrum of the quantum dot may be 60 nm or less, for example, 55 nm or less. When a FWHM of the quantum dot is within these ranges, high colorimetric purity, suitable (e.g., excellent) color reproducibility, and/or improved wide viewing angle may be achieved.

As described above, the composition of each of the first shell, the second shell, and the third shell form a concentration gradient, thus having a structure with a reduced lattice mismatch. Therefore, the quantum dot according to an embodiment may have suitable (e.g., excellent) absorbance to blue light, and defect generation at the interface between the core and the shell is reduced, thereby protecting the core of the quantum dot utilizing a shell of sufficient thickness while simultaneously (or concurrently) achieving high light efficiency and high colorimetric purity.

In some embodiments, the form of the quantum dot may be a form generally utilized in the related art and is not particularly limited. In some embodiments, the quantum dot may be in a spherical form, a pyramidal form, a multi-armed form, and/or may be a cubic nanoparticle, a nanotube, a nanowire, a nanofiber, a nano-plate particle, and/or the like.

In some embodiments, the quantum dot may further include additional compounds other than the foregoing composition.

In some embodiments, the quantum dot may further include a II-VI compound, a III-VI compound, a III-V compound, a IV-VI compound, a Group IV element or compound, a compound, or a combination thereof in the core, the first shell, the second shell, and/or the third shell.

The II-VI compound may be selected from a binary compound selected from the group consisting of CdS, CdSe, CdTe, ZnS, ZnSe, ZnTe, ZnO, HgS, HgSe, HgTe, MgSe, MgS, and a mixture thereof; a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a quaternary compound selected from the group consisting of CdZnSeS, CdZnSeTe, CdZnSTe, CdHgSeS, CdHgSeTe, CdHgSTe, HgZnSeS, HgZnSeTe, HgZnSTe, and a mixture thereof.

The III-VI compound may include a binary compound (such as $In_2S_3$ and/or $In_2Se_3$); a ternary compound (such as $InGaS_3$ and/or $InGaSe_3$); or any combination thereof.

The III-V compound may be selected from a binary compound selected from the group consisting of GaN, GaP, GaAs, GaSb, AlN, AlP, AlAs, AlSb, InN, InP, InAs, InSb and a mixture thereof; a ternary compound selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, GaAlNP, and a mixture thereof; and a quaternary compound selected from the group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof. The III-V semiconductor compound may further include a Group II metal (e.g., InZnP).

The IV-VI compound may be selected from a binary compound selected from the group consisting of SnS, SnSe, SnTe, PbS, PbSe, PbTe, and a mixture thereof; a ternary compound selected from the group consisting of SnSeS, SnSeTe, SnSTe, PbSeS, PbSeTe, PbSTe, SnPbS, SnPbSe, SnPbTe, and a mixture thereof; and a quaternary compound selected from the group consisting of SnPbSSe, SnPbSeTe, SnPbSTe, and a mixture thereof. The Group IV element may be selected from the group consisting of Si, Ge, and a mixture thereof. The IV compound may be a binary compound selected from the group consisting of SiC, SiGe, and a mixture thereof.

The semiconductor compounds may include a ternary compound such as AgInS, $AgInS_2$, CuInS, $CuInS_2$, $CuGaO_2$, $AgGaO_2$, $AgAlO_2$, or any combination thereof.

In this case, the binary compound, the ternary compound, and/or the quaternary compound may be present in particles at a uniform concentration or a non-uniform concentration, e.g., by being partially divided into different concentrations in the same particle.

In some embodiments, the first shell, the second shell, and/or the third shell may further include metal oxide or an oxide of non-metal, a semiconductor compound, or a combination thereof.

In some embodiments, the metal oxide or nonmetal oxide may be a binary compound (such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and/or NiO) or a ternary compound (such as $MgAl_2O_4$, $CoFe_2O_4$, $NiFe_2O_4$, and/or $CoMn_2O_4$).

In some embodiments, the semiconductor compound may be CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, and/or AlSb.

In some embodiments, a color-conversion member including the quantum dot may be provided.

In some embodiments, at least one portion of the color-conversion member may include the quantum dot (e.g., a plurality of the quantum dots), and the quantum dot may absorb blue light and emit visible light other than blue light, for example, visible light having a maximum emission wavelength in a range of about 500 nm to about 650 nm. Accordingly, a color-conversion member including the quantum dot may be designed to absorb blue light and emit wavelengths in various suitable color ranges.

In some embodiments, at least one portion of the color-conversion member may include the quantum dot (e.g., a plurality of the quantum dots), and the quantum dot may absorb blue light and emit green light having a maximum emission wavelength in a range of about 500 nm to about 600 nm. Accordingly, a color-conversion member including the quantum dot may emit green light with high luminance and high colorimetric purity.

Apparatus

According to one or more embodiments, an apparatus including the quantum dot may be provided.

In some embodiments, a color-conversion member including the quantum dot and an apparatus including an optical source may be provided.

Figure 2:
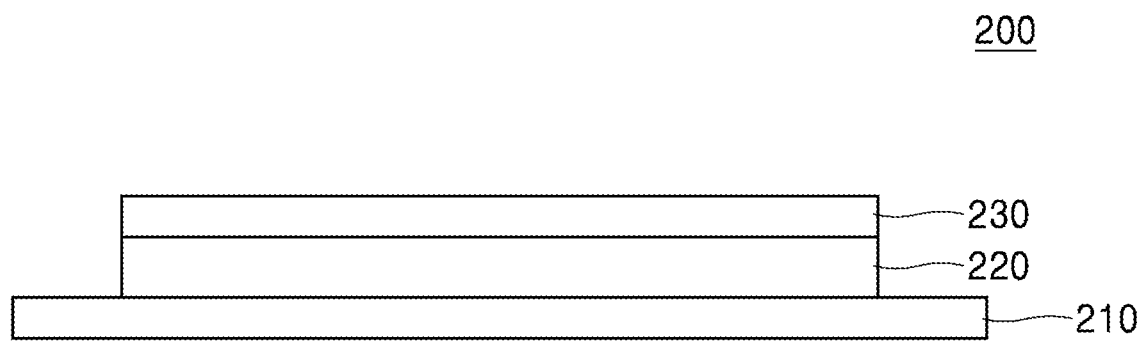
FIG. 2 is a schematic view of an apparatus according to an embodiment.

In some embodiments, referring to FIG. 2, an apparatus 200 may include a substrate 210; a light source 220 on the substrate; and a color-conversion member 230 on the light source 220.

The apparatus 200 shown in FIG. 2 is an example of the apparatus described herein. The apparatus may have various suitable forms (e.g., known in the art), and various suitable (e.g., known) features may be further included.

In some embodiments, the optical source 220 may emit blue light having a maximum emission wavelength in a range of about 400 nm to about 490 nm.

In some embodiments, the light source 220 may be a backlight unit (BLU) utilized in a liquid crystal display (LCD), a fluorescent lamp, a light-emitting device, an organic light-emitting device, a quantum dot light-emitting device (QLED), or any combination thereof, but embodiments are not limited thereto. The color-conversion member 230 may be disposed on at least one traveling direction of light emitted from the light source 220.

Here, the feature that the color-conversion member 230 is disposed on at least one traveling direction of light emitted from the light source 220 may not exclude that other elements are further included between the color-conversion member 230 and the light source 220.

In some embodiments, a polarizer, a liquid crystal layer, a light guide plate, a diffusion plate, a prism sheet, a microlens sheet, a luminance enhancement sheet, a reflective film, a color filter, or any combination thereof may be interposed between the light source 220 and the color-conversion member 230.

In some embodiments, a polarizer, a liquid crystal layer, a light guide plate, a diffusion plate, a prism sheet, a microlens sheet, a luminance enhancement sheet, a reflective film, a color filter, or any combination thereof may be disposed on the color-conversion member 230.

In some embodiments, the display apparatus may include a structure in which a light source, a light guide plate, a color-conversion member, a first polarizer, a liquid crystal layer, a color filter, and a second polarizer are sequentially arranged.

In some embodiments, the display apparatus may include a structure in which a light source, a light guide plate, a first polarizer, a liquid crystal layer, a second polarizer, and a color filter are sequentially arranged.

In embodiments of the display apparatus, the color filter may include a pigment or dye. In embodiments of the display apparatus, one of the first polarizer and the second polarizer may be a vertical polarizer, and the other one may be a horizontal polarizer.

In some embodiments, at least one portion of the color-conversion member 230 in the apparatus 200 may include the quantum dot (e.g., a plurality of the quantum dots), and the at least one portion may absorb blue light emitted from the optical source 220 and emit visible light other than blue light, for example, visible light having a maximum emission wavelength in a range of about 500 nm to about 750 nm. Accordingly, a color-conversion member including the quantum dot may be designed to absorb blue light emitted from the optical source and emit wavelengths in various suitable color ranges.

In some embodiments, at least one portion of the color-conversion member 230 in the apparatus 200 may include the quantum dot (e.g., a plurality of the quantum dots), and the at least one portion may absorb blue light emitted from the optical source 220 and emit green light having a maximum emission wavelength in a range of about 500 nm to about 600 nm. In some embodiments, the quantum dot may emit red light having a maximum emission wavelength in a range of about 600 nm to about 750 nm. Accordingly, a color-conversion member including the quantum dot may absorb blue light emitted from a light source and emit green light or red light having high luminance and suitable (e.g., excellent) colorimetric purity. In some embodiments, the apparatus may exhibit a National Television System Committee (NTSC) color gamut of 105% or higher, for example, a NTSC color gamut of 108% or higher.

The apparatus may be, for example, an emission apparatus, an authentication apparatus, and/or an electronic apparatus, but embodiments are not limited thereto.

The emission apparatus may be utilized in various suitable displays, light sources, and/or the like.

The authentication apparatus may be, for example, a biometric authentication apparatus that identifies an individual according to biometric information (e.g., a fingertip, a pupil, and/or the like).

The authentication apparatus may further include a biometric information collecting unit.

The electronic apparatus may be applicable to a personal computer (e.g., a mobile personal computer), a cellphone, a digital camera, an electronic note, an electronic dictionary, an electronic game console, a medical device (e.g., an electronic thermometer, a blood pressure meter, a glucometer, a pulse measuring device, a pulse wave measuring device, an electrocardiograph recorder, an ultrasonic diagnosis device, an endoscope display device, etc.), a fish finder, various suitable measurement devices, gauges (e.g., gauges of an automobile, an airplane, a ship, etc.), a projector, etc., but embodiments are not limited thereto.

In an embodiment, the apparatus may include an LCD, an organic light-emitting display apparatus or an inorganic light-emitting display apparatus.

The apparatus may further include a thin film transistor.

Hereinafter a quantum dot according to an embodiment and a method of preparing the quantum dot will be described in more detail with reference to Examples.

EXAMPLES

[Preparation Example 1] Preparation of Stock Solution

1) SeTOP Stock Solution 1.78 mmol of Se powder was dissolved in 1 milliliter (mL) of trioctylphosphine (TOP, 97%) to prepare a selenium and trioctylphosphine (SeTOP) stock solution.

2) SeSTOP-1 Stock Solution 0.06 mmol of Se powder and 2 mmol of sulfur powder were dissolved in 2 mL of TOP to prepare a selenium, sulfur, and trioctylphosphine (SeSTOP-1) stock solution.

3) SeSTOP-2 Stock Solution 0.02 mmol of Se powder and 4 mmol of sulfur powder were dissolved in 2 mL of TOP to prepare a selenium, sulfur, and trioctylphosphine (SeSTOP-2) stock solution.

4) $ZnSt_2$ Stock Solution 4.74 mmol of zinc stearate ($ZnSt_2$) and 15 mL of octadecene were mixed in a 150 mL three-neck flask, and the mixture was heated up to 120° C., followed by degassing. Then, the mixture was vacuum-dried at 120° C. for 1 hour. The temperature was raised to 250° C. under nitrogen atmosphere to prepare a $ZnSt_2$ stock solution. The prepared $ZnSt_2$ stock solution was stored in a three-neck flask at 250° C. under nitrogen atmosphere.

[Synthesis Example 1] Preparation of Green InP/ZnSe/ZnSe$_x$S$_{1-x}$/ZnS Quantum Dot (Green QD)

0.111 g (0.225 mmol) of indium (III) iodide, 0.15 g (1.1 mmol) of zinc (II) chloride, and 0.351 g (1.1 mmol) of zinc (II) iodide were mixed with 6.0 mL of industrial oleylamine. The mixture was then stirred at 120° C. for 1 hour and degassed, followed by heating up to 180° C. in an inert atmosphere. When the desired temperature was reached, 0.4 mL (1.47 mmol) of tris(diethylamino)phosphine (($DEA)_3P$) (phosphorus:indium ratio=6.5:1) as a phosphorus precursor was quickly added to this mixture.

Figure 3:
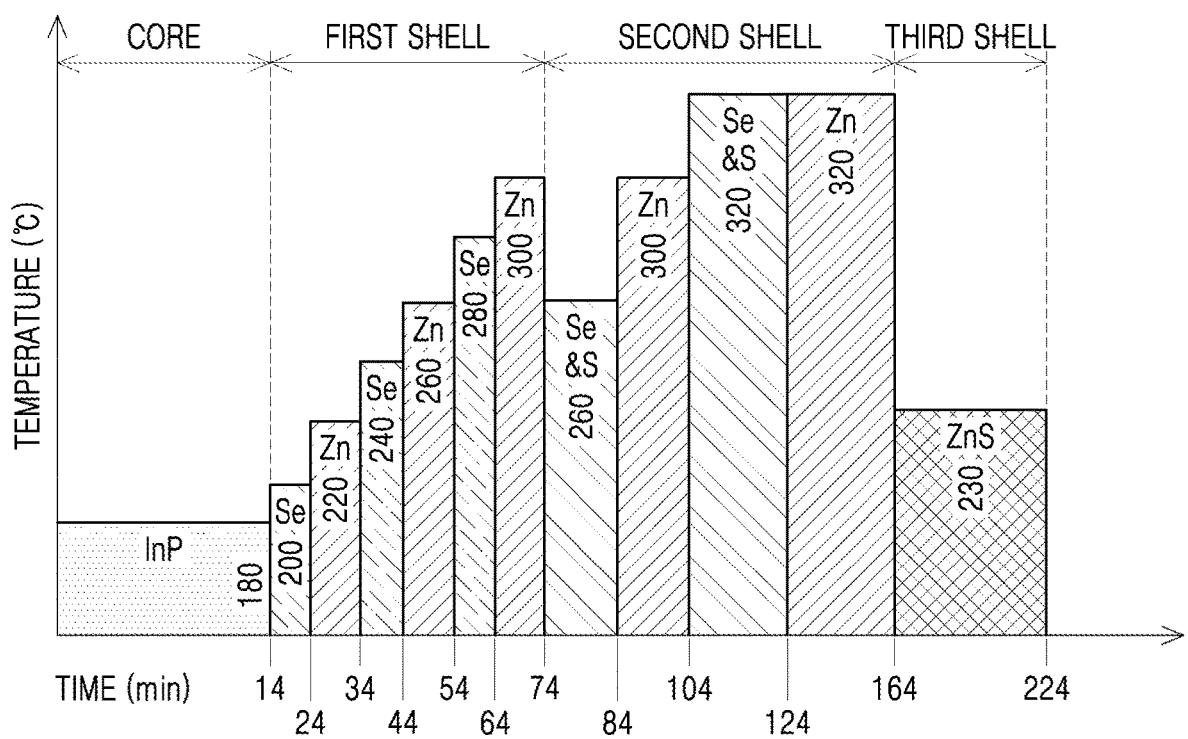
FIG. 3 is a view showing a synthesis processes of a green quantum dot and temperature according to one or more embodiments.

After the injection of the phosphorus precursor, an InP core was grown for 14 minutes at the desired temperature (see FIG. 3). The ZnSeS intermediate shell was grown by sequentially and alternately injecting an ionic shell precursor and a cationic shell precursor. First, 0.09 mL of the SeTOP stock solution was injected to the mixture, and the temperature was maintained at 200° C. for 10 minutes. Then, 0.5 mL of the $ZnSt_2$ stock solution was slowly injected to the mixture, and the temperature was maintained at 220° C. for 10 minutes. Then, 0.09 mL of the SeTOP stock solution was injected to the mixture, and the temperature was maintained at 240° C. for 10 minutes. Then, 0.5 mL of the $ZnSt_2$ stock solution was slowly injected to the mixture, and the temperature was maintained at 260° C. for 10 minutes. Then, 0.09 mL of the SeTOP stock solution was injected to the mixture, and the temperature was maintained at 280° C. for 10 minutes. Then, 0.5 mL of the $ZnSt_2$ stock solution was slowly injected to the mixture, and the temperature was maintained at 300° C. for 10 minutes (thereby completing the formation of the first shell). Then, the mixture was cooled to 260° C., followed by injection of 2 mL of the SeSTOP-1 stock solution, followed by maintaining the temperature at 260° C. for 10 minutes. Then, 6 mL of the $ZnSt_2$ stock solution was slowly injected to the mixture, and the temperature was maintained at 300° C. for 20 minutes. Then, 2 mL of the SeSTOP-2 stock solution was slowly injected to the mixture, and the temperature was maintained at 320° C. for 10 minutes. Then, 7 mL of the $ZnSt_2$ stock solution was slowly injected to the mixture, and the temperature was maintained at 320° C. for 40 minutes (thereby completing the formation of the second shell). Subsequently, for the passivation of the ZnS shell, a reaction flask was cooled at room temperature, and 0.22 g (1.2 mmol) of zinc acetate ($Zn(OAc)_2$) and 0.48 mL (2 mmol) of 1-dodecanethiol were added to the reaction flask at room temperature, followed by heating up to 230° C. for 1 hour (thereby completing the formation of the third shell). Once the reaction was complete, the mixture was cooled to room temperature. For purification of the crude product, 2 mL of chloroform, 1 mL of ethanol, and excess amount of acetone were added to the mixture solution until the solution was murky, followed by centrifuge at 10,000 rotations per minute (rpm). After the centrifuge, the supernatant was removed, and the precipitate was re-dispersed in organic solvents such as chloroform, toluene, and/or hexane to thereby obtain a green QD composition.

[Synthesis Example 2] Preparation of Red InP/ZnSe/ZnSe$_x$S$_{1-x}$/ZnS Quantum Dot (Red QD)

Figure 4:
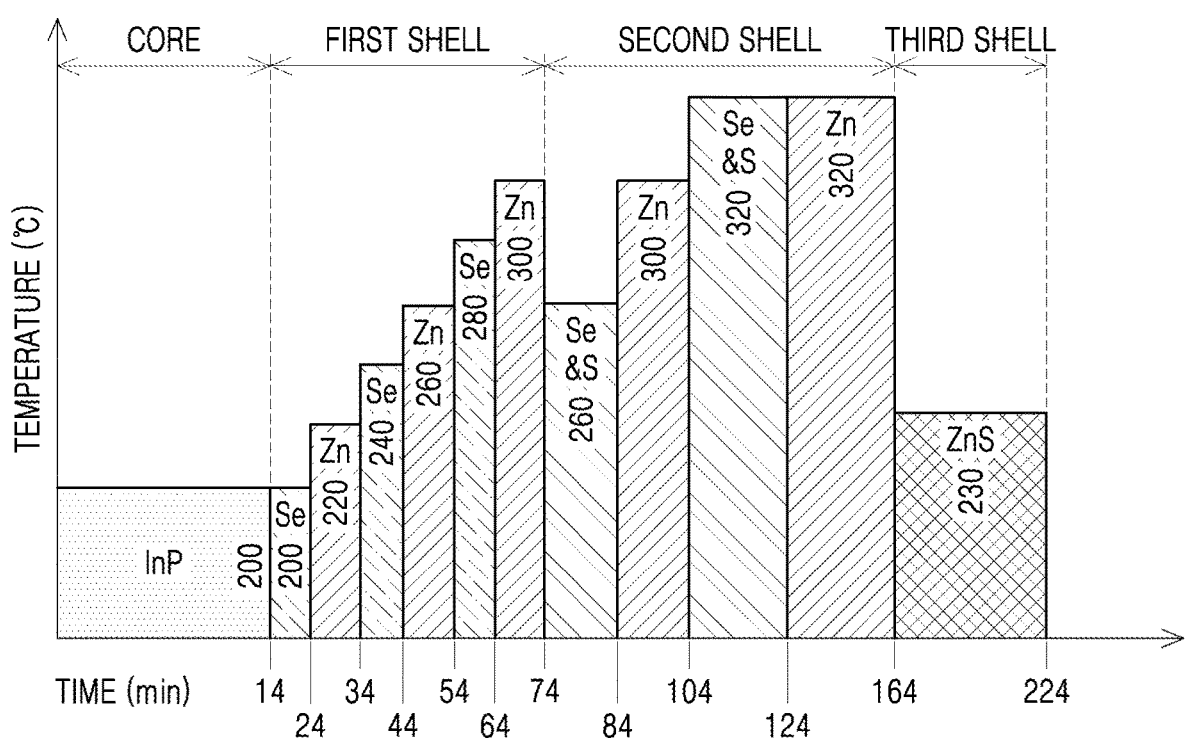
FIG. 4 is a view showing a synthesis processes of a red quantum dot and temperature according to one or more embodiments.

0.111 g (0.225 mmol) of indium (III) iodide, 0.15 g (1.1 mmol) of zinc (II) chloride, and 0.351 g (1.1 mmol) of zinc (II) iodide were mixed with 6.0 mL of industrial oleylamine. The mixture was then stirred at 120° C. for 1 hour and degassed, followed by heating up to 200° C. in an inert atmosphere. A red QD composition was obtained by performing the injection of the phosphorus precursor and the following processes in substantially the same manner as in Synthesis Example 1 (see FIG. 4).

Comparative Synthesis Example 1

0.2 mmol of indium acetate, 0.125 mmol of zinc acetate, 0.6 mmol of palmitic acid, and 10 mL of 1-octadecene were added to a reactor, and the reactor was heated at 120° C. under vacuum. 1 hour later, the reactor was purged with nitrogen. After heating at 250° C., a mixture solution of 0.15 mmol of tris(trimethylsilyl)phosphine ($TMS_3P$) and 1 mL of trioctylphosphine was quickly injected thereto and reacted for 20 minutes. Acetone was added to the reaction solution, which was quickly cooled to room temperature, followed by centrifuge to obtain a precipitate. The precipitate was dispersed in toluene to thereby prepare a toluene dispersion of the InP semiconductor nanocrystal.

1.2 mmoL (0.224 g) of zinc acetate, 2.4 mmol (0.757 g) of oleic acid, and 10 mL of trioctylamine were added to a reaction flask and vacuum-treated at 120° C. for 10 minutes. The flask was purged with $N_2$, and the temperature was raised to 280° C. A toluene dispersion of the prepared InP semiconductor nanocrystal (OD=optical density of $1^{st}$ excitonic absorption, OD:0.15 or 1 mL of 1 wt % toluene solution) was quickly injected thereto within 10 seconds. Subsequently, 2.4 mmol of S/TOP was added thereto, followed by reaction for 120 minutes.

Once the reaction was complete, ethanol was added to the reaction solution that was quickly cooled to room temperature for precipitation. The precipitate was centrifuged and re-dispersed in toluene to prepare a quantum dot.

[Evaluation Example 1] Evaluation of Quantum Dot Photoluminescence

From the PL spectra, the emission centroid wavelength (e.g., maximum emission wavelength), FWHM, quantum yield, and blue light absorption rate of the quantum dots prepared in Synthesis Examples 1 and 2 and Comparative Synthesis Example 1 were each evaluated utilizing Quantum Efficiency Measurement System QE-2100 (available from Otsuka). The results thereof are shown in Table 1. (Excitation wavelength: 365 nm, 458 nm)

TABLE 1

|  | Maximum emission wavelength (nm) | FWHM (nm) | Quantum yield (%) |
|---|---|---|---|
| Synthesis Example 1 | 530 | 39 | 55% |
| Synthesis Example 2 | 632 | 45 | 85% |
| Comparative Synthesis Example 1 | 632 | 53 | 47% |

Comparative Example 1

DCR-TR711R, DCR-TR711G, and DCR-TR711B (available from Dongjin Semichem Co., Ltd) were respectively utilized as the red, green, and blue color filter (CF) compounds. First, 1 cm² quartz substrate was impregnated with a mixture solution of isopropanol and acetone (at a volume ratio of 1:1), followed by ultrasonic treatment for 10 minutes. Then, a drying process was performed under nitrogen gas. The dried quartz substrate was attached to a guide ring (1 cm×1 cm), and the blue, green, and red CF compounds were uniformly coated on a respective quartz substrate to prepare a color filter.

A white light-emitting device (LED) was utilized as a backlight unit (BLU), and an LCD device of Comparative Example 1 was prepared to have a structure of BLU/light guide film (LGF)/vertical polarizer/nematic liquid crystal/horizontal polarizer.

Example 1

The green QD stock solution of Synthesis Example 1 and the red QD stock solution of Synthesis Example 2 were dispersed in hexane at a weight ratio of 20 wt %. The resulting solution was mixed with silicone resin to prepare a composite resin. A guide ring (1 cm×1 cm) was attached to a dried quartz substrate, and the composite resin was uniformly coated on the substrate. Then, the substrate was dried and cured at room temperature to prepare a quantum dot enhancement film (QDEF).

A blue LED was utilized as a BLU to prepare an LCD device of Example 1 having a structure of BLU/LGF/QDEF/vertical polarizer/nematic liquid crystal/horizontal polarizer.

Example 2

The green and red CF compounds (same as those in Comparative Example 1) were respectively mixed with 0.3 mL of the green QD solution of Synthesis Example 1 and 0.3 mL of the red QD solution of Synthesis Example 2. Then, the two mixtures were mixed with a specific blue CF to obtain a new mixture. The new mixture was uniformly coated on a 1 cm² quartz substrate to which a guide ring (1 cm×1 cm) was attached and dried and cured at room temperature to prepare a QDCF (quantum dot color filter).

A blue LED was utilized as a BLU to prepare an LCD device of Example 2 having a structure of BLU/LGF/vertical polarizer/nematic liquid crystal/horizontal polarizer/QDCF.

[Evaluation Example 2] Analysis of Optical Characteristics of Display

An LCD device exhibits the best color gamut when the emission wavelengths are separated from each other within the wavelength range that transmits through the blue, green and red CFs. The crosstalk of emission wavelengths after the CF transmission has a significant effect on the efficiency of the device. Accordingly, to analyze optical characteristics of a display, the polarized photoluminance (PL) emission and FWHM were measured and compared utilizing a polarizer microscope (available from Nikon Inc.).

Figure 5A:
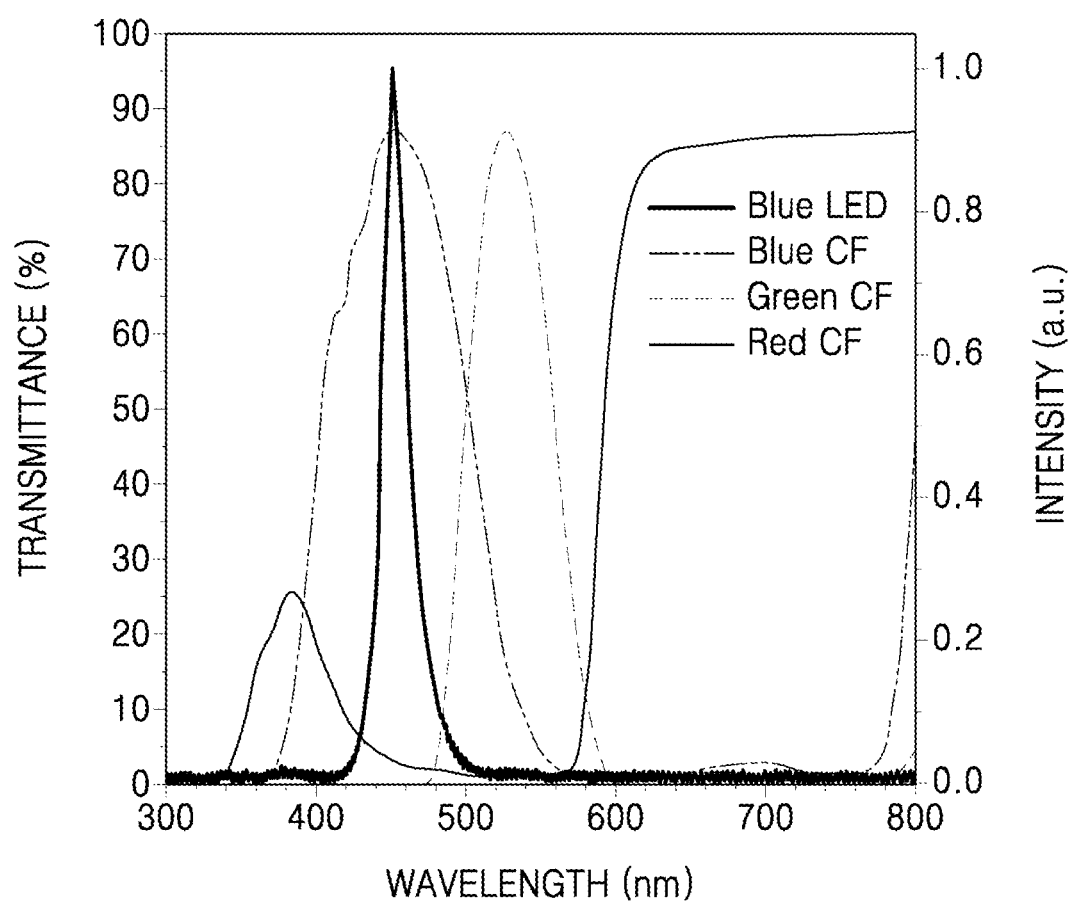
FIGS. 5A-5D are each a graph showing optical characteristics of a display device manufactured according to one or more embodiments.

First, blue, green, and red CFs were each coated on a respective quartz slide as standard samples to measure emission spectra. The wavelength spectra of the Blue CF (371 nm to 563 nm, $\lambda_{max}$=451 nm), Green CF (478 nm to 595 nm, $\lambda_{max}$=527 nm), and Red CF (>570 nm, $\lambda_{max}$=631 nm) are shown in FIG. 5A. In addition, in the LCD device of the present disclosure, because blue light is emitted from the blue LED BLU, the emission spectrum was measured by placing a blue LED as a BLU in the PL spectrometer as a standard sample (Blue LED). As a result, BLU emitted a maximum emission at a wavelength of 452 nm (FIG. 5A).

Figure 5B:
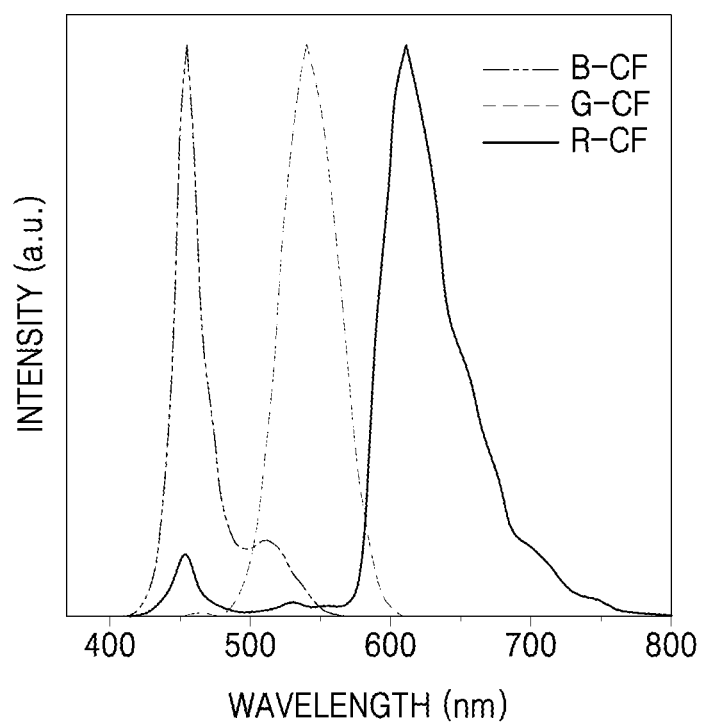

The LCD device of Comparative Example 1 emitted polarized light of blue (B-CF) at 456 nm with FWHM of 20.6 nm, green (G-CF) at 541 nm with FWHM of 49.1 nm, and red (R-CF) at 612 nm with FWHM of 58.7 nm. Significant crosstalk was exhibited among emission spectra (FIG. 5B).

Figure 5C:
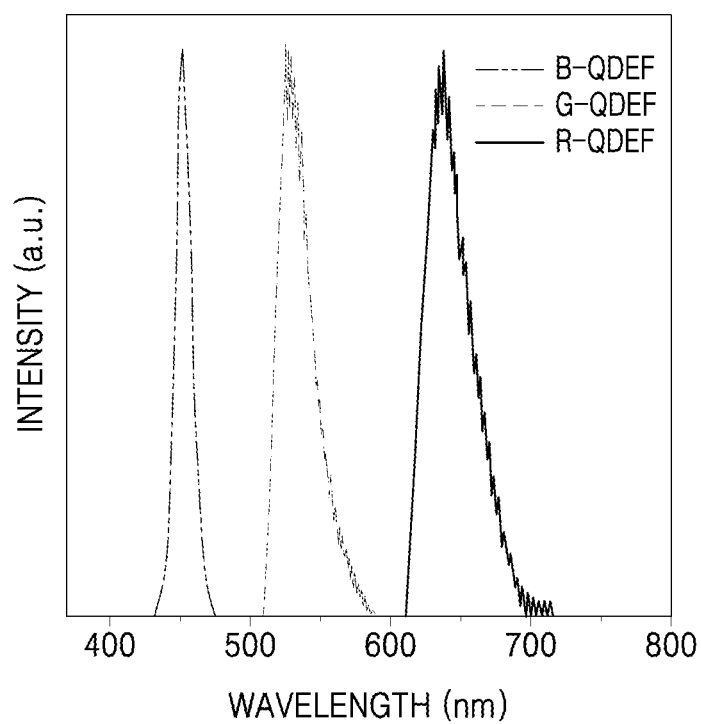

The QDEF-LCD device of Example 1 emitted polarized light of blue (B-QDEF) at 452 nm with FWHM of 20.4 nm, green (G-QDEF) at 528 nm with FWHM of 31.3 nm, and red (R-QDEF) at 638 nm with FWHM of 36.4 nm. Little (e.g., no or non-significant amount of) crosstalk was exhibited among the emission peaks (FIG. 5C).

Figure 5D:
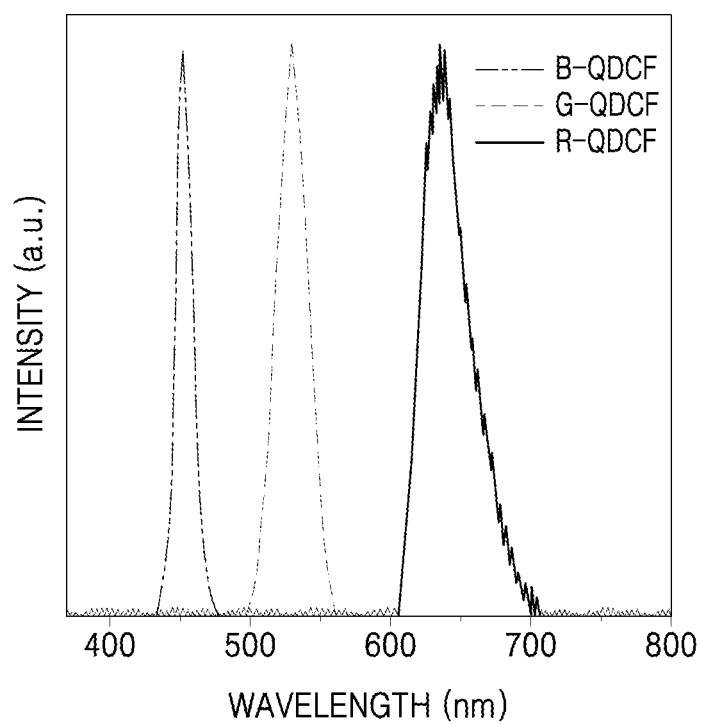

The QDCF-LCD device of Example 2 emitted polarized light of blue (B-QDCF) at 452 nm with FWHM of 20.4 nm, green (G-QDCF) at 530 nm with FWHM of 26.1 nm, and red (R-QDCF) at 638 nm with FWHM of 36.7 nm. Little (e.g., no or non-significant amount of) crosstalk was exhibited among the emission peaks (FIG. 5D), as in Example 1.

In Table 2, the LCD devices of Comparative Example 1, the QDEF-LCD device of Example 1, and the QDCF-LCD device of Example 2 are compared.

TABLE 2

|  |  | Peak frequency | Maximum emission wavelength (nm) | FWHM (nm) | Color coordinate (x,y) | Color gamut NTSC (%) | Color gamut Rec.2020 (%) |
|---|---|---|---|---|---|---|---|
| Comparative Example 1 | Blue (B-CF) |  | 456 | 20.6 | (0.14, 0.10) | 73.7 | 55.1 |
|  | Green (G-CF) |  | 541 | 49.1 | (0.29, 0.68) |  |  |
|  | Red (R-CF) |  | 612 | 58.7 | (0.61, 0.33) |  |  |

TABLE 2-continued

|  |  | Maximum emission |  | Color | Color gamut | |
|---|---|---|---|---|---|---|
|  | Peak frequency | wavelength (nm) | FWHM (nm) | coordinate (x,y) | NTSC (%) | Rec.2020 (%) |
| Example 1 | Blue (B-QDEF) | 452 | 20.4 | (0.15, 0.03) | 95.2 | 71.2 |
|  | Green (G-QDEF) | 528 | 31.3 | (0.24, 0.70) |  |  |
|  | Red (R-QDEF) | 638 | 36.4 | (0.64, 0.30) |  |  |
| Example 2 | Blue (B-QDCF) | 452 | 20.4 | (0.15, 0.03) | 108.8 | 81.4 |
|  | Green (G-QDCF) | 530 | 26.1 | (0.18, 0.74) |  |  |
|  | Red (R-QDCF) | 638 | 36.7 | (0.65, 0.30) |  |  |

Referring to FIGS. 5A-5D and Table 2, blue emission of the QDEF-LCD device of Example 1 and the QDCF-LCD device of Example 2 each showed a narrow FWHM of about 20 nm, and as compared with the LCD device of Comparative Example 1, FWHMs of green and red emission were each significantly reduced.

[Evaluation Example 3] Analysis of Display Color Reproducibility

To analyze the color reproducibility for evaluating the possibility (e.g., suitability) as an ultra-high-resolution LCD display, the performance of the LCD device of Comparative Example 1, the QDEF-LCD device of Example 1, and the QDCF-LCD device of Example 2 were compared with one another by estimating coordinates in the CIE 1931 color spaces according to the two standards of NTSC 1953 and Rec. 2020. The CIE coordinates were calculated utilizing the PL spectrum of FIGS. 5B-5D and the MATLAB-based CIE coordinate calculator. The results thereof are shown in Table 2. In addition, the two standard color spaces are represented in a triangular shape within the CIE color space and are shown in FIG. 6.

Figure 6:
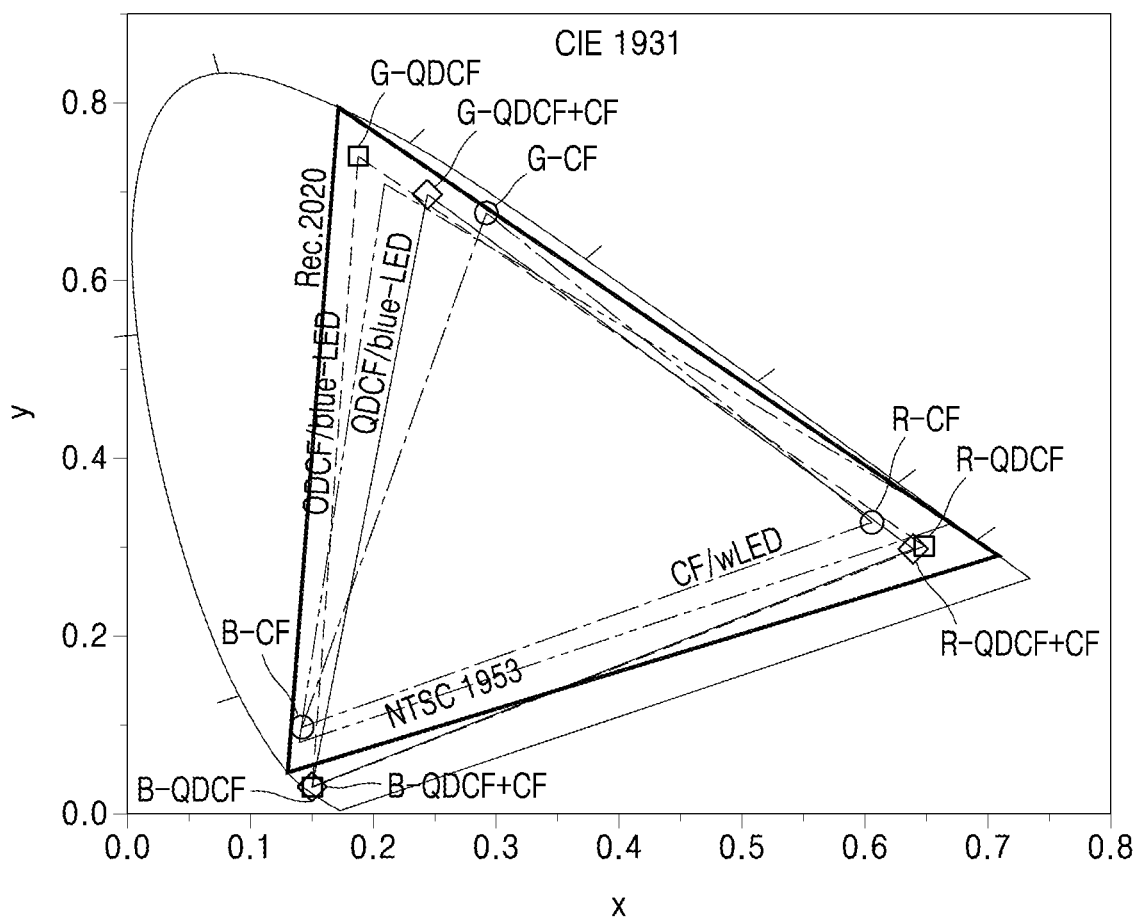
FIG. 6 is an image of color gamut of display devices manufactured according to one or more embodiments.

Referring to Table 2 and FIG. 6, the RGB color reproducibility of the LCD device of Comparative Example 1 was 73.7% according to the NTSC standard and 55.1% according to the Rec.2020 standard, which was found to be more suitable for the standard resolution display rather than an ultra-high definition (UHD) display. The color reproducibility of the QDEF-LCD device of Example 1 (QDCF+CF) was 95.2% according to the NTSC standard and 71.2% according to the Rec.2020 standard, and the color reproducibility of the QDCF-LCD device of Example 2 was 108.8% according to the NTSC standard and 81.4% according to the Rec.2020 standard. Thus, the QDEF-LCD device of Example 1 and the QDCF-LCD device of Example 2 were found to show improved color reproducibility. Therefore, it was found that the QDEF-LCD device of Example 1 and the QDCF-LCD device of Example 2 are suitable for a UHD display, as compared with the LCD device of Comparative Example 1.

As apparent from the foregoing description, the method of preparing the quantum dot is eco-friendly and may provide a non-cadmium-based quantum dot with high luminescence efficiency, and high stability. Accordingly, when the quantum dot is applied to a color-conversion member, crosstalk among emitted wavelengths is reduced to thereby improve color reproducibility.

The use of "may" when describing embodiments of the inventive concept refers to "one or more embodiments of the inventive concept." Also, the term "exemplary" is intended to refer to an example or illustration.

The terminology used herein is for the purpose of describing particular example embodiments only and is not intended to be limiting of the invention. As used herein, the singular forms "a," "an" and "the" are intended to include the plural forms as well, unless the context clearly indicates otherwise.

As used herein, the term "substantially," "about," and similar terms are used as terms of approximation and not as terms of degree, and are intended to account for the inherent deviations in measured or calculated values that would be recognized by those of ordinary skill in the art. Moreover, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112, first paragraph, or 35 U.S.C. § 112(a), and 35 U.S.C. § 132(a).

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and equivalents thereof.

What is claimed is:

1. A method of preparing a quantum dot, wherein the quantum dot comprises:
   a core comprising a III-V compound;
   a first shell surrounding the core and comprising ZnSe;
   a second shell surrounding the first shell and comprising $ZnSe_{1-x}S_x$, wherein x is a real number greater than 0 and smaller than 1; and a third shell surrounding the second shell and comprising ZnS, the method comprising:

forming the first shell from a first solution comprising a first material comprising zinc and a second material comprising selenium;

forming the second shell by adding a third material comprising zinc and a fourth material comprising selenium and sulfur to the first solution to form a second solution; and forming the third shell by adding a fifth material comprising zinc to the second solution, wherein the forming of the first shell comprises act (a) of adding the first material and act (b) of adding the second material, the forming of the second shell comprises act (c) of adding the third material and act (d) of adding the fourth material, and wherein the fourth material is about 0.1:1 to about 0.0005:1 in molar ratio of the selenium to the sulfur.

2. The method of claim 1, wherein the forming of the first shell comprises performing each of act (a) and act (b) at least two times.

3. The method of claim 1, wherein the forming of the first shell comprises sequentially conducting following acts:

act (a1) of adding the first material;

act (b1) of adding the second material;

act (a2) of adding the first material; and act (b2) of adding the second material, wherein as act (a1), act (b1), act (a2), and act (b2) are sequentially performed, a reaction temperature gradually increases.

4. The method of claim 1, wherein the forming of the second shell comprises repeatedly performing each of act (c) and act (d) at least two times.

5. The method of claim 1, wherein the forming of the second shell comprises sequentially conducting following acts:

act (c1) of adding the third material;

act (d1) of adding the fourth material;

act (c2) of adding the third material; and act (d2) of adding the fourth material, wherein as act (c1), act (d1), act (c2), and act (d2) are sequentially performed, a reaction temperature gradually increases.

6. The method of claim 1, wherein the first material and the third material each comprise zinc stearate.

7. The method of claim 1, wherein
the second material comprises selenium powder, and
the fourth material comprises selenium powder and sulfur powder.

8. The method of claim 1, wherein selenium in $ZnSe_{1-x}S_x$ comprised in the second shell is greater in content toward the first shell and lower in content toward the third shell, thus forming a concentration gradient.

9. The method of claim 1, wherein the III-V compound is selected from GaN, GaP, GaAs, GaSb, AlN, AlP, AlAs, AlSb, InN, InP, InAs, InSb, GaNP, GaNAs, GaNSb, GaPAs, GaPSb, AlNP, AlNAs, AlNSb, AlPAs, AlPSb, InGaP, InNP, InNAs, InNSb, InPAs, InPSb, GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a combination thereof.

10. The method of claim 1, wherein the method further comprises forming the core comprising the III-V compound from a Group III precursor and a Group V precursor.

11. The method of claim 1, wherein the forming of the third shell is performed at a temperature lower than a temperature in the forming of the second shell.

12. The method of claim 1, wherein the fifth material comprises zinc acetate.

13. The method of claim 1, wherein the first solution further comprises a zinc precursor and an organic ligand.

14. A quantum dot prepared according to the method of claim 1.

15. An optical member comprising the quantum dot of claim 14.

16. The optical member of claim 15, wherein the optical member is a color-conversion member.

17. An apparatus comprising the quantum dot of claim 14.

18. The apparatus of claim 17 comprising:

a light source to emit light; and a color-conversion member located on a pathway of light emitted from the light source, wherein the color-conversion member comprises the quantum dot.

19. The apparatus of claim 18, wherein the light source is an organic light-emitting device (OLED) or a light-emitting diode (LED), and the light source is to emit blue light having a maximum emission wavelength in a range of about 400 nanometers (nm) to about 490 nm.

20. The apparatus of claim 19, wherein at least one portion of the color-conversion member comprises the quantum dot, and the at least one portion is to absorb the blue light emitted from the light source and to emit visible light other than blue light.

* * * * *